United States Patent
Rahim

[19]

[11] Patent Number: 6,069,382
[45] Date of Patent: May 30, 2000

[54] NON-VOLATILE MEMORY CELL HAVING A HIGH COUPLING RATIO

[75] Inventor: Irfan Rahim, Milpitas, Calif.

[73] Assignee: Cypress Semiconductor Corp., San Jose, Calif.

[21] Appl. No.: 09/022,222

[22] Filed: Feb. 11, 1998

[51] Int. Cl.$^7$ .................................................. H01L 29/788
[52] U.S. Cl. .......................................... 257/316; 257/649
[58] Field of Search .................................. 257/316, 317, 257/321, 324, 649

[56] References Cited

U.S. PATENT DOCUMENTS

| | | | |
|---|---|---|---|
| 3,984,822 | 10/1976 | Simko et al. ............................. | 257/316 |
| 3,996,657 | 12/1976 | Simko et al. ............................. | 257/316 |
| 4,119,995 | 10/1978 | Simko ...................................... | 257/317 |
| 4,376,947 | 3/1983 | Chiu et al. ............................... | 257/316 |
| 4,495,693 | 1/1985 | Iwahashi et al. ....................... | 257/316 |
| 4,811,291 | 3/1989 | De Ferron ............................... | 257/317 |
| 4,851,361 | 7/1989 | Schumann et al. . | |
| 5,471,422 | 11/1995 | Chang et al. . | |
| 5,656,840 | 8/1997 | Yang . | |
| 5,841,162 | 11/1998 | Enomoto ................................. | 257/314 |
| 5,892,258 | 4/1999 | Kobatake ................................ | 257/317 |
| 5,895,950 | 4/1999 | Walker et al. ........................... | 257/315 |
| 5,900,656 | 5/1999 | Park ......................................... | 257/314 |
| 5,925,908 | 7/1999 | Dahl et al. .............................. | 257/314 |
| 5,946,240 | 8/1999 | Hisamune ............................... | 257/316 |

OTHER PUBLICATIONS

K. Sakui et al., NAND Flash Memory Technology and Future Direction, presented at the 15$^{th}$ Annual IEEE Non–Volatile Semiconductor Memory Workshop, Monterey, CA Feb. 9–12, 1997.

Wei–Hua Liu et al., A 2–Transistor Source–select (2TS) Flash EEPROM for 1.8V–only applications Semiconductor Technologies Laboratory, Motorola Inc., Austin, Texas.

Betty Prince, Semiconductor Memories A Handbook of Design, Manufacture and Application, Second Edition, John Wiley & Sons, 1983, 1991, West Sussex, England (excerpted).

Stanley Wolf, Ph.D. Silicon Processing For The VLSI Era, vol. 2: Process Integration, Lattice Press, 1990, Sunset Beach, CA (excerpted).

*Primary Examiner*—David Hardy
*Attorney, Agent, or Firm*—Young Law Firm, P.C.

[57] ABSTRACT

A non-volatile memory cell includes a floating gate having a bottom surface in contact with a tunnel layer formed on the substrate, a top surface, and sidewall surfaces oriented along the bitline direction and along the wordline direction of the memory cell. A dielectric layer covers at least a portion of the top surface and covers at least a portion of the surfaces oriented along the bitline and wordline directions. A control gate overlaps the floating gate over substantially all of its surface area. A plurality of self-aligned sidewall spacers are provided, disposed against at least the dielectric layer and the control gate sidewalls. By overlapping the control gate over the floating gate, a greater surface area is made available for charge storage and/or for increasing the coupling ratio of the memory cell. This allows the width of wing structures to be decreased, while maintaining a high coupling ratio. This greater surface area, by increasing the coupling ratio of the memory cell, also allows the use of low programming and erase voltages. Charge retention and coupling are also increased by substantially overlapping or encapsulating the floating gate by the control gate, thus keeping it isolated from other structures, such as sidewall spacers.

16 Claims, 3 Drawing Sheets

NON-VOLATILE MEMORY CELL HAVING A HIGH COUPLING RATIO

BACKGROUND OF THE INVENTION

1. Field of the Invention

The invention pertains to the field of non-volatile memory cells. In particular, the present invention relates to non-volatile memory cells having a high coupling ratio.

2. Description of the Related Art

Charge retention, namely the ability of memory devices to maintain a charge stored therein, is a major concern of semiconductor devices manufacturers. Charge retention is of particular importance to non-volatile storage devices, as their designed retention time is now measured in terms of years and even decades. One of the causes of decreased charge retention is believed to be leakage, in which charges stored within nitride traps or on a floating gate leak away by, for example, tunneling through a thin oxide layer. This undesirable leakage may even occur without the presence of erase voltage. As the charges leak away, the informational content of the cell may become ambiguous and data may be lost.

One way to decrease the effects of this leakage is to increase the stored charge and to increase the coupling ratio of the device. A high coupling ratio helps to decrease the high voltage required for programming and erasing the memory cell. For this purpose, it is desirable to increase the surface area available for capacitive coupling, the charge storage mechanism for memory non-volatile memory cells. For floating gate memory cells, the charge is typically stored on a gate that is separated from the channel by a thin oxide layer called a tunnel oxide layer, through which charge carriers migrate via Fowler-Nordheim tunneling. Another gate layer is situated above the floating gate layer, and is called the control gate. The floating gate is isolated from the control gate by an interpolysilicon dielectric layer.

FIG. 1 is a cross sectional view of a one transistor (hereafter 1T) non-volatile memory cell, taken along the bit line direction. Reference numeral 180 represents the bitline contact and reference numeral 170 represents the Vss contact. As the structures of interest here reside above the substrate, a representation of the substrate and associated implant regions has been omitted from FIG. 1 for the sake of brevity. A thin oxide layer 110 separates the floating gate layer (hereafter FG layer) 120 from the underlying channel region of the substrate. This thin oxide layer 110 is typically about 100 Å microns in thickness, and allows for Fowler-Nordheim tunneling as a means of programming and erasing. Between the control gate (hereafter CG) layer 140 and the FG layer 120 is a dielectric layer 130. Finally, sidewall spacers 150 provide the necessary isolation and protection of the FG and CG layers 120 and 140, respectively.

FIG. 2 is a cross sectional view of the non-volatile memory cell of FIG. 1, taken along the wordline direction. Field isolation oxide structures 260 separate the transistors from one another. The tunneling oxide 110 separates the FG layer 120 from the underlying substrate. The dielectric layer 130 separates the FG layer 120 from the CG layer 140. The CG layer 140 is common among the transistors of a same row, and acts as a wordline of the array. In order to increase the coupling capacitance between the CG layer 140 and the FG layer 120, the FG layer 120 and its overlying dielectric layer 130 are extended past the boundaries of the tunnel oxide 110 to form so-called wings 290. The wings 290 provide additional surface area on which the charges migrating across the tunneling oxide 110 may accumulate. These wings 290 allow the memory cell to have an increased coupling ratio and a lower voltage to be used for both programming and erase functions. The wings increase the total charge that may be stored by the FG layer 120, but they decrease the number of transistors that may be fitted onto a wordline of a given width. Indeed, due to the presence and width of the wings 290, the width of each such non-volatile memory cell is much greater than the minimum Field Oxide Mask (hereafter FOM) width. The FOM is an isolation mask structure (generally the LOCOS isolation oxide) and defines the device width by separating the active regions of adjacent devices. The CG 140 contacts the field oxide isolation structures 260 at the wordline sidewall surfaces 295. Therefore, charge carriers may accumulate on the FG layer 120 along the wordline sidewall surfaces 295, along the wings 290 and over the tunneling oxide 110. In other words, the charge carriers may accumulate over an area corresponding to the surface area of the dielectric layer 130. The greater this surface area, the greater the capacitance and the greater the coupling ratio.

FIG. 5 shows a schematic representation of the CG layer 140, and the manner in which it overlaps the FG layer 120. The orientation of the CG layer 140 is shown by the arrows adjacent the illustrated structure. Indeed, the active area, the wings and the WL (wordline) sidewalls are aligned in the wordline direction, corresponding to the plane of the paper in FIG. 2. The orientation of the WL sidewalls themselves, however, is along the bitline direction, i.e., into and out of the plane of the paper in FIG. 2. As shown in FIG. 5, the CG layer 140 overlaps the FG layer 120 over the active area, corresponding to the width of the tunneling oxide 110 over the induced channel, over the wings 290, and over the wordline sidewalls 295 (denoted by the legend WL sidewall in FIG. 5). Typically, the active area and the wings 290 have a width of about 0.35 $\mu$m, whereas the height of the WL sidewalls is about 0.2 $\mu$m. Capacitance is proportional to the area onto which charges may accumulate divided by the thickness of the intervening dielectric. In a stacked double polysilicon structure, such as shown in FIG. 1, wherein the polysilicon layers are separated from one another by a dielectric layer and wherein the floating gate layer is separated from the underlying substrate by a tunnel oxide, the capacitance ratio C.R. of the structure is generally defined by the expression:

$$C.R. = \frac{C_{dialectric}}{C_{dialectric} + C_{tunnel}}$$

where $C_{dielectric}$ is the capacitance formed by the control and floating gate layers and $C_{tunnel}$ is the capacitance between the substrate and the floating gate layer. Assuming that the ratio of thickness' of the dielectric and tunnel layers is about 2.2, the capacitance ratio for the structure shown in FIG. 1 is about:

$$C.R. = \frac{3(0.35 \times 0.35) + 2(0.2 \times 0.35)}{2.2(0.35 \times 0.35) + 3(0.35 \times 0.35) + 2(0.2 \times 0.35)}$$

This results in a coupling ratio of about 0.65 for the structure shown in FIG. 1.

The structure shown in FIGS. 1 and 2, however, is not completely satisfactory, for at least the following reasons. At the outset, it is apparent that the width of the device is greatly affected by the size of the wings. To maintain a high coupling ratio in the face of shrinking device dimensions, the wide wings 290 shown in FIG. 2 are required. Wings of large size, by increasing the width of the device, necessarily reduce the number of such transistors that can be fitted along a wordline of a given size. Reducing the width of the wings 290 would allow a greater number of such devices to fit across a given wordline, but the ability of the FG layer 120 to store charge would be proportionally reduced.

In an effort to address this problem, Shallow Trench Isolation (SA-STI) structures have been proposed to reduce the width of the cell without decreasing the capacitive coupling between the floating and control gates. On representative example of such an approach is shown in K. Sakui et al., *NAND Flash Memory Technology and Future Direction*, presented at the 15$^{th}$ Annual IEEE Non-Volatile Semiconductor Memory Workshop, Monterey, Calif. Feb. 9–12, 1997. In Sakui et al., a Self-Aligned Shallow Trench Isolation (SA-STI) technology is utilized to separate neighboring bits, instead of a field oxide or LOCOS structures. The shallow trench structure allows Sakui et al to eliminate wing structures in favor of a structure wherein the control gate is extended to cover the sidewalls of the floating gate, again in the general fashion shown in FIG. 5. This increases the coupling ratio of the device, even through the wing structures have been eliminated. However, SA-STI structures require complex processing, and the sidewalls of the trench structures are highly susceptible to performance degrading contamination from impurities such as reactive mobile ions and the like.

Moreover, SA-STI structures are not readily or economically incorporated into other devices, such as SRAM structures. Indeed, to incorporate non-volatile memory structures into SRAM arrays, for example, it is generally accepted that the extra processing steps and cost necessitated thereby should be kept to a minimum, typically not to exceed 20% of the process steps and costs of a SRAM array alone.

What is needed, therefore, is a memory cell of small dimensions that maintains a high coupling ratio. What is also needed is a non-volatile memory cell having a high coupling ratio and improved charge retention characteristics. What is also needed is a non-volatile memory that is readily incorporated into other technologies, such as SRAM technology. What is also needed is a memory cell, the formation of which does not necessitate an unacceptable number of processing steps that are not shared with other MOS structures.

SUMMARY OF THE INVENTION

It is, therefore, an object of the present invention to provide memory cell of small dimensions that maintains a high coupling ratio. It is also an object of the present invention to provide a non-volatile memory cell having a high coupling ratio and improved charge retention characteristics. It is another object of the present invention to provide a non-volatile memory that is readily incorporated into other technologies, such as SRAM technology. It is a still further object of the present invention to provide a memory cell, the formation of which does not necessitate an unacceptable number of processing steps that are not shared with other MOS structures.

In accordance with the above objects and those that will be mentioned and will become apparent below, the non-volatile memory cell according to one embodiment of the present invention, comprises:
 a floating gate having a bottom surface in contact with a tunnel layer formed on a substrate, a top surface, and sidewall surfaces oriented along a bitline direction and along a wordline direction of the memory cell;
 a dielectric layer, the dielectric layer covering at least a portion of the top surface and covering at least a portion of the sidewall surfaces oriented along the bitline and wordline directions;
 a control gate, the control gate overlapping the floating gate over substantially all of its top surface and sidewall surfaces; and
 a plurality of sidewall spacers disposed against sidewalls of the control gate and/or the dielectric layer.

According to other embodiments, the dielectric layer may include an ONO layer. The dielectric layer may form at least one extension on the substrate in the bitline direction. In that case, the thickness of the control gate along the wordline direction is about equal to the length of the extension or extensions of the dielectric layer on the substrate.

The non-volatile memory cell may also include a top layer formed on the control gate, the plurality of sidewall spacers also being disposed against the top layer. The non-volatile memory cell may further comprise at least one self-aligned contact, the self-aligned contact or contacts being aligned with an edge of the top layer, and having a tapered shape that conforms to a shape of the sidewalls spacers. The top layer and the plurality of sidewall spacers layer may be made of a material having a lower etch rate than the etch rate of an overlying interlayer dielectric. The top layer and the plurality of sidewall spacers may include a nitride.

According to another exemplary embodiment, the non-volatile memory cell having a high coupling ratio according to the present invention comprises:
 a floating gate separated from a substrate by a tunnel layer, a width of the tunnel defining a width of an active region of the cell,
 a dielectric layer, the dielectric layer overlapping the floating gate over substantially all surfaces thereof not in contact with the tunnel oxide, the dielectric layer forming wings oriented along a wordline direction, the wings having widths that are less than the width of the active region; and
 a control gate overlapping substantially all of the floating gate and having sidewalls oriented along both a wordline direction and a bitline direction of the memory cell.

According to further embodiments, the width of the memory cell is about equal to the minimum pitch of the field oxide mask used to define field oxide isolation structures of the memory cell. The width of the wings may be less than about 0.2 µm. The coupling ratio of the memory cell may be about 0.67 for a 0.35 µm process and a dielectric layer to tunnel layer thickness ratio of about 2.2.

According to a still further embodiment, the non-volatile memory cell according to the present invention comprises sidewall spacers disposed against the sidewalls of the control gate; and self-aligned bitline and Vss contacts, the bitline and Vss contacts being self-aligned to the control gate sidewalls and including a tapered end conforming to a shape of the sidewall spacers. The non-volatile memory cell may also comprise heavily doped well regions under the bitline and Vss contacts, lightly doped source and drain regions aligned with the sidewalls of the control gate and at least one implant region aligned with an interior surface of the dielectric layer.

According to another illustrative embodiment, the non-volatile memory cell according to the present invention comprises:
 a substrate,
 a tunnel oxide formed on the substrate;
 a floating gate disposed on the tunnel oxide and having sidewall surfaces along a bitline direction and a wordline direction;

a dielectric layer formed on the floating gate and along at least one sidewall surface thereof that is oriented along the wordline direction;

a control gate overlapping the floating gate, the control gate having a non-zero thickness along at least one floating gate sidewall surface oriented in the wordline direction;

a top layer disposed on the control gate, and sidewall spacers disposed along outside edges of the control gate.

Advantageously, the dielectric layer and the control gate also extend along the sidewall surfaces of the floating gate oriented along the bitline direction. The dielectric layer may extend in the bitline direction along the substrate for a distance determined by a thickness of the control gate along the wordline direction.

BRIEF DESCRIPTION OF THE DRAWINGS

For a further understanding of the objects and advantages of the present invention reference should be made to the following detailed description, taken in conjunction with the accompanying figures, in which.

DESCRIPTION OF THE PREFERRED EMBODIMENTS

The demand for ever-greater device densities continues to drive efforts to miniaturize device dimensions. However, in the memory arena and in the field of non-volatile memories in particular, while the horizontal dimensions have experienced rapid downward scaling, the vertical dimensions of the devices have not kept pace. Indeed, the vertical dimensions of the polysilicon gate structures, of the tunnel oxide structure and of the interpolysilicon dielectric layer remains comparatively large, as compared to their horizontal dimensions. Likewise, Lynch Values (minimum distance between critical layers) are getting shorter than the thickness of the polysilicon layers. The present invention exploits these trends to achieve a memory cell having small dimensions, a high coupling ratio, improved charge retention characteristics and ease of integration with other technologies.

Figure 3:
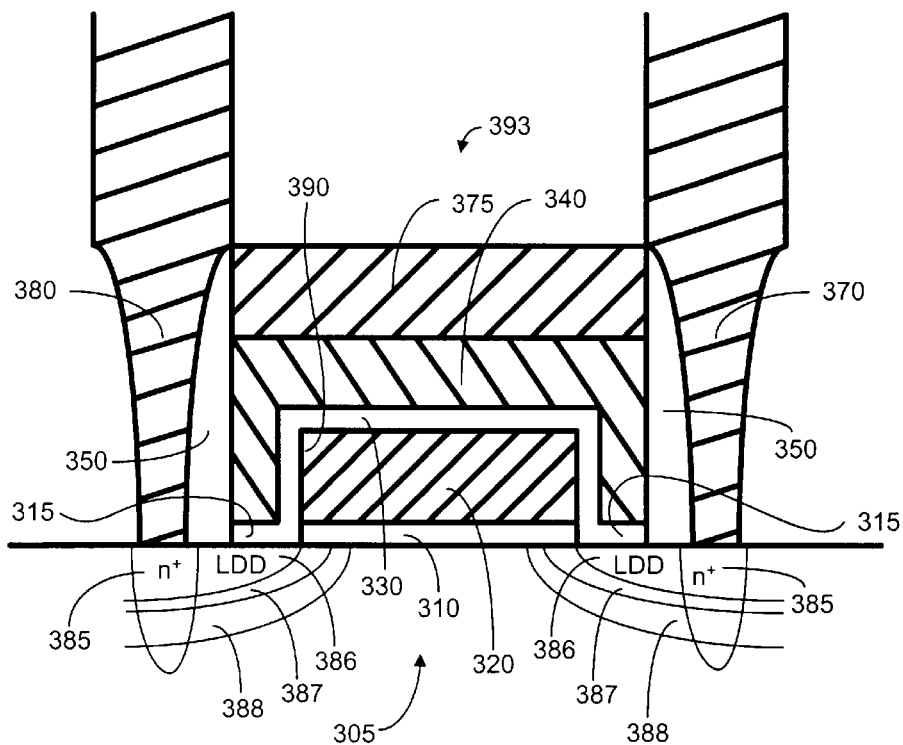
FIG. 3 is a cross section of a memory cell according to the present invention, taken along the bitline direction.
Figure 4:
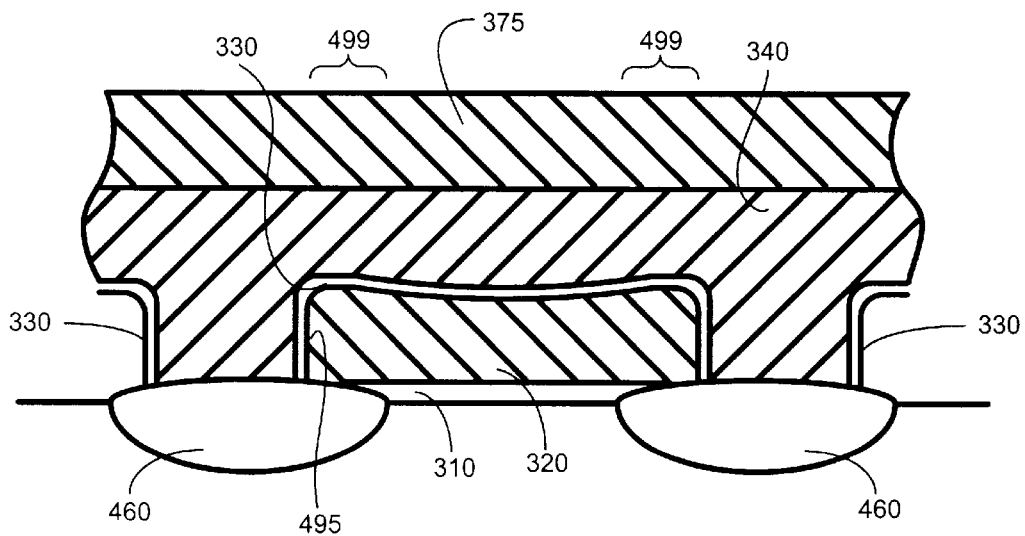
FIG. 4 is a cross section of a memory cell according to the present invention, taken along the wordline direction.

An embodiment of the present invention is shown in FIGS. 3 and 4. FIGS. 3 and 4 are cross-sections of one embodiment of the non-volatile memory cell according to the present invention, taken along the bitline and the wordline directions, respectively. With reference to FIGS. 3 and 4, a thin tunnel oxide 310 separates the substrate 305 from the floating gate (hereafter FG) layer 320. The FG layer 320 may be formed of polysilicon. A dielectric layer 330, which may be formed of Oxide-Nitride-Oxide (hereafter ONO), covers the FG layer 320 over substantially all of the surface area thereof that is not in contact with the tunnel oxide 310. That is, the dielectric layer 330 covers the top surface of the FG layer 320 that is opposite the surface in contact with the tunnel oxide 310, as well as the surfaces 390 of the FG layer 320 that are oriented perpendicular to the bitline direction and the surfaces 495 (shown in FIG. 4) of the FG layer 320 that are oriented perpendicular to the wordline direction. The dielectric layer 330 also includes extensions 315 along the substrate 305 in the bitline direction.

A control gate (hereafter CG) layer 340 covers the dielectric layer 330 over substantially all of its exposed surface area. Indeed, the CG layer 340 surrounds the dielectric layer 330, forming a control gate layer that overlaps the CG layer 330 on its top surface, as well as along its sidewalls oriented along the bitline and wordline directions. The thickness of the CG layer 340 along the sidewalls oriented along the wordline direction is about equal to the length of the extension 315 of the dielectric layer 330, to isolate the CG layer 340 from the underlying substrate 305. The CG may also be formed of polysilicon. A top layer 375 is disposed on the CG layer 340. The top layer 375 may be formed of silicon nitride or of another material having a relatively slow etch rate. After the top layer 375, the CG layer 340 and the dielectric layer 330 are etched, sidewall spacers 350 are formed, as shown in FIG. 3. The sidewall spacers 350 are preferably formed of silicon nitride. One or more Inter Layer Dielectric (ILD) layers 393 may be formed above the top layer 375, along with one or more metalization layers. The etch rate of the ILD layer 393 may be higher than the etch rate of the underlying top layer 375.

Assuming a p-type substrate 305, deeply implanted n⁺ wells 385 are formed under the bitline and Vss contacts 380, 370. An lightly doped drain (LDD) structure 386, aligned with the outside edge of the dielectric layer 330 and the CG layer 340, is formed in both the source and drain regions of the device. Other n-type impurity implanted regions 387 and 388 are then formed, aligned with the outside edges of the FG 320. For example, the n-type impurity for implant region 387 may be arsenic, whereas the n-type impurity for implant region 388 may be phosphorous. It should be noted, however, that the substrate may be n-type, whereupon the implants and wells would then be formed of selected p-type impurities, as those of skill in this art will readily recognize.

Figure 1:
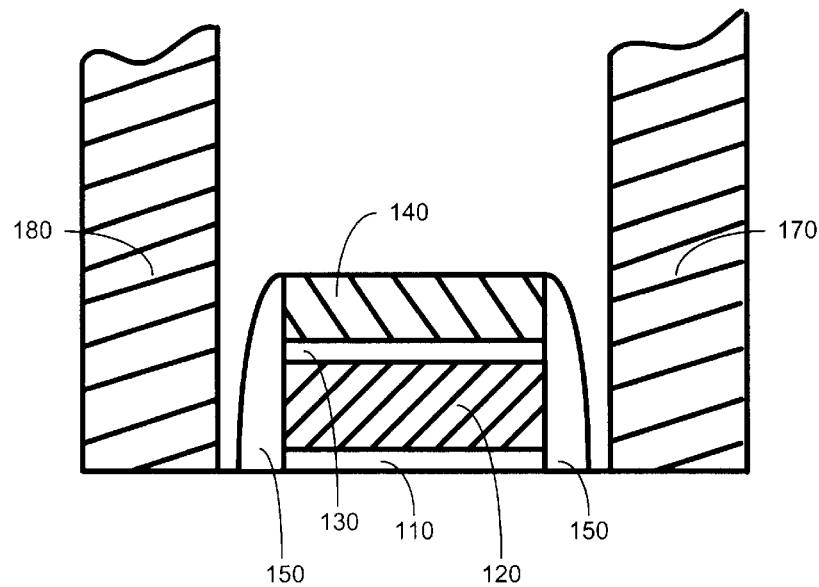
FIG. 1 is a cross section of a non-volatile memory cell, taken along the bitline direction.

The nitride top layer 375 functions as etch stop layer, allowing the bitline contact 380 and the Vss contact 370 to be formed closer together than was previously possible. Indeed, during the etching of the bitline contact 380 and the Vss contact 370, the top layer 375 acts as an etch stop layer, permitting the bitline and Vss contacts 380, 370 to self-align with the outside edges of the top layer 375 and the sidewall spacers 350. Had the top layer 375 not been present during the etching of the bitline and Vss contacts 380, 370, the etching step to form the bitline and Vss contacts also would have etched the CG layer 340. This is the reason that, in FIG. 1, the bitline and Vss contacts 180, 170 must be formed at a distance from the sidewall spacers 150, to insure that any etching step carried out does not also inadvertently etch the CG layer 140.

The bitline and Vss contacts 380, 370 are thus formed against the sidewall spacers 350 and have a tapered shape where they are co-extensive therewith. This tapered shape conforms to the shape of the sidewall spacers 350. In as much as the bitline and Vss contacts 380, 370 are disposed against and are tapered by the sidewall spacers 350, they compensate for the relatively greater memory cell width caused by placing a portion of the dielectric layer 330 and the CG layer 340 on surfaces that are oriented along the wordline direction, as shown in FIG. 4.

Figure 2:
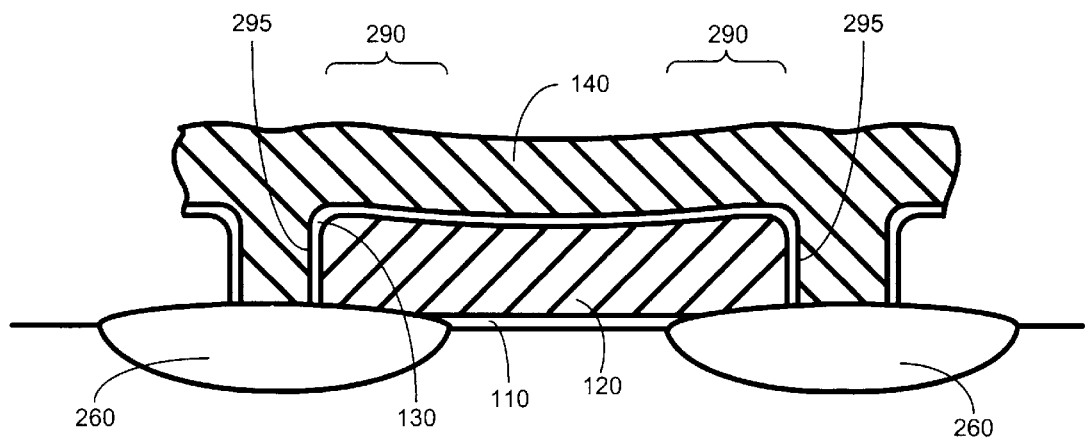
FIG. 2 is a cross section of the non-volatile memory cell of FIG. 1, taken along the wordline direction.

Disposing the dielectric layer 330 and the CG layer 340 on surfaces that are oriented along the wordline direction increases the coupling capacitance of the resultant device and allows the width of the wings to be correspondingly decreased. As shown in FIG. 4, the width of the wings 499 has been markedly decreased, as compared to the wings 290 shown in FIG. 2. As a result, the width of the memory cell according to the present invention may be about equal to the minimum FOM pitch, that is, about equal to the spacing between the isolation structures 460 (formed by LOCOS, for example). The reduction in the available surface area caused by the reduction in the width of the wings in the memory cell according to the present invention is offset at least partially by the additional surface area available for charge accumulation along the FG gate 320 along the wordline direction, as will be quantitatively shown below.

Figure 5:
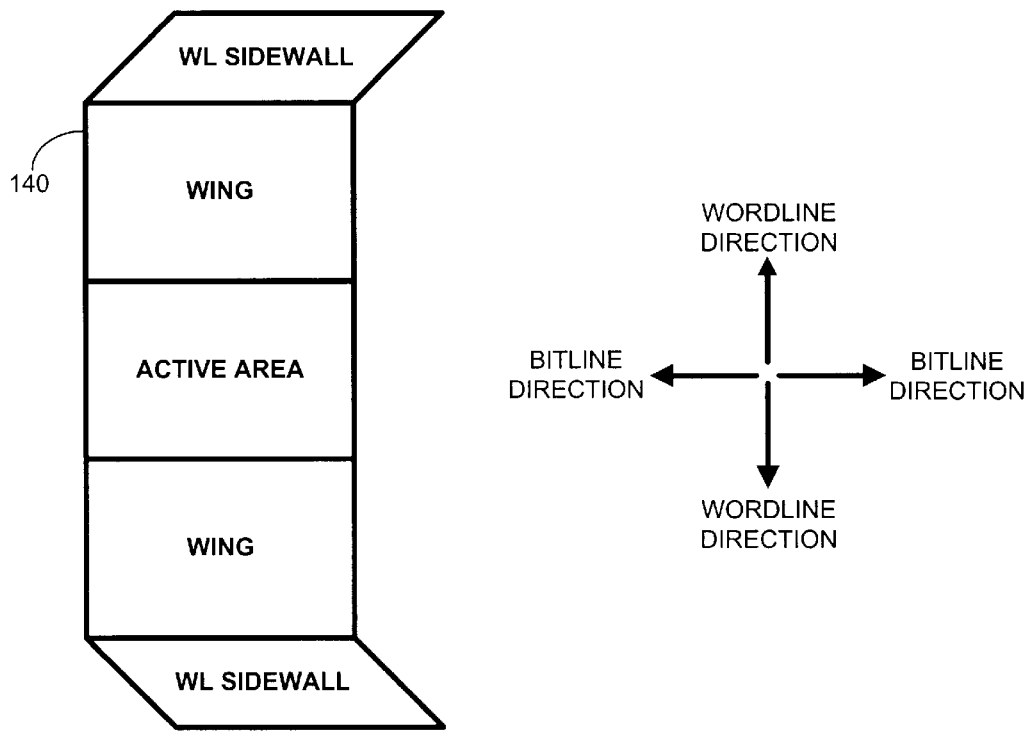
FIG. 5 shows a schematic representation of a control gate layer of the non-volatile memory cell of FIGS. 1 and 2, and the manner in which it overlaps the floating gate layer.
Figure 6:
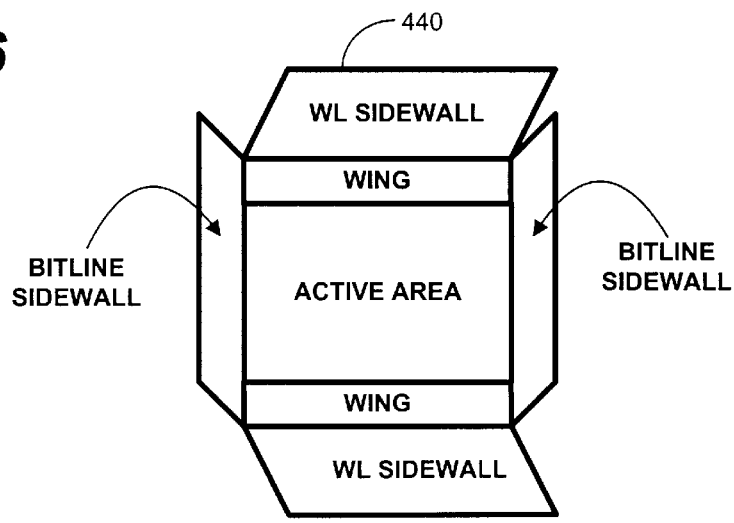
FIG. 6 shows a schematic representation of a control gate layer of a memory cell according to the present invention, and the manner in which it overlaps the floating gate layer.

Covering the FG layer 320 with the dielectric layer 310 and the CG layer 340 on all sides or surfaces not in contact with the tunnel oxide 310 provides the opportunity to maintain or increase the coupling capacitance of the device. A schematic illustration of the topography of the CG layer 340 is found in FIG. 6. FIG. 6 is oriented in the same manner as FIG. 5; namely, the active area, the wings and the WL (wordline) sidewalls are aligned along the wordline direction. The WL sidewalls, as shown in FIG. 6, while aligned along the wordline direction, are oriented perpendicular thereto, along the bitline direction. This direction corresponds to the plane of the paper in FIG. 4. Unlike the illustration of the control gate shown in FIG. 5, the control gate according to the present invention shown in FIG. 6 also includes at least one bitline side surface or bitline sidewall aligned in the bitline direction and oriented perpendicular thereto, along the wordline direction. The orientation of the bitline sidewalls is into and out of the plane of the paper in FIG. 3. Indeed, as FIG. 3 is a cross-section of the memory cell according to the present invention taken along the bitline direction, the thickness of the bitline sidewalls is visible, between the sidewall spacers 350 and the dielectric layer 330.

The control gate according to the present invention, as shown in FIG. 6, may be said to encapsulate or overlap the floating gate. It should be noted that the dielectric layer 330 shown in FIGS. 4 and 5 must be interposed between the floating gate and the control gate wherever they face each other, to insure charge storage.

As shown in FIG. 6, the width of the memory cell in the bitline direction is increased by virtue of the bitline sidewalls, as such portions necessarily have a non-zero thickness. Moreover, according to the present invention, the width of the memory cell in the wordline direction is greatly decreased, as the width of the wings is decreased. Such decrease is made possible by the additional surface area provided by the bitline sidewalls. This additional surface area allows the width of the wings to be decreased without, however, necessarily decreasing the coupling ratio of the resulting device. Of course, the coupling ratio of the memory cell according to the present invention may be further increased by maintaining wings of large width, as shown in FIG. 5, as well as by adding a control gate layer along the bitline direction, as shown by the bitline sidewalls in FIG. 6.

In one illustrative embodiment of the present invention, the active area is about 0.35 $\mu$m by about 0.35 $\mu$m, the wings are about 0.1 $\mu$m by about 0.35 $\mu$m, the WL sidewalls are about 0.2 $\mu$m by about 0.35 $\mu$m and the bitline sidewalls are about 0.2 $\mu$m by about 0.55 $\mu$m. Note that the dimensions of the WL sidewalls and of the active area are the same as set forth relative to FIG. 5, for ease of comparison. However, the width of the wings, according to the present invention, has been decreased from 0.35 $\mu$m to about 0.1 $\mu$m, thus reducing the overall width of the device by over 50%. Other dimensions may be selected, as those of skill in this art will readily recognize. For the same 0.35 $\mu$m process, and the same 2.2 ratio for dielectric layer to tunnel oxide thickness ratio, the coupling ratio of the memory cell according to the present invention works out to about:

$$C.R. = \frac{(0.35 \times 0.35) + 2(0.1 \times 0.35) + 2(0.2 \times 0.35) + 2(0.55 \times 0.2)}{2.2(0.35 \times 0.35) + (0.35 \times 0.35) + 2(0.1 \times 0.35) + 2(0.2 \times 0.35) + 2(0.55 \times 0.2)} \approx 0.67$$

Thus, by reducing the dimensions of the wings and taking advantage of the sidewalls of the floating gate oriented along the wordline direction for placement of the dielectric and control gate layers, the coupling ratio may be maintained at a high level and even increased while providing a substantially more compact memory cell.

One additional advantage is derived from the topography of the dielectric layer 330 and of the CG layer 340 of the memory cell according to the present invention, and the manner in which they overlap or encapsulate the FP layer 320. Indeed, nitride sidewall spacers are known to include charge traps, which may move about and cause reflected charges to appear on the floating and gate polysilicon layers if placed in contact therewith, as they are in FIGS. 1 and 2. These traps degrade the charge retention characteristics of the device. However, in the present invention, the nitride sidewall spacers are separated from the FG layer 320 by a conductive layer, namely the CG layer 340, which is believed to act as a Faraday cage, to prevent electric lines of force from entering therein. The FG layer 320, as shown in FIGS. 3 and 4, is well protected from any charge traps from the nitride layers 350, by the encapsulating dielectric and CG layers 330 and 340, respectively. Therefore, the coupling ratio of the memory cell is markedly increased, as compared to conventional devices. This allows the memory cell according to the present invention to be programmed and erased with comparatively low voltages, while maintaining adequate charge storage characteristics. The functionality of the non-volatile memory according to the present invention is, therefore, correspondingly increased.

The memory cell according to the present invention, by virtue of its simple structure, compact design and self-aligned bitline and Vss contacts, may readily be incorporated in SRAM memory structures. Indeed, only three mask layers are unique to the processing of the non-volatile memory cell according to the present invention, all others being common to SRAM processing. The first such mask layer that is unique to the processing of the present invention is the tunnel mask, which is laid down to grow a thin oxide for the tunnel oxide 310 (to allow F-N tunneling to occur) and a thicker oxide layers for other devices, including programming transistors. The second mask that is unique to the processing of the present invention is the mask that defines the edge of the FG layer 320. The last mask that is unique to the non-volatile one transistor (IT) memory cell according to the present invention is the Array Protect Mask, or APM, to remove the interpolysilicon dielectric layer, such as the dielectric layer 330 from the CMOS area. Therefore, the non-volatile IT memory cell (which may be a Flash-type non-volatile memory cell) according to the present invention is compact in design, enjoys the benefits of a high coupling ratio, improved charge retention characteristics and self-aligned contacts, and may be included in other CMOS processes such as SRAM arrays in an economical manner, as only three extra masks are required for its manufacture.

While the foregoing detailed description has described preferred embodiments of the present invention, it is to be understood that the above description is illustrative only and not limiting of the disclosed invention. For example, the materials selected for the various layers may differ from those disclosed herein, as may the dimensions thereof Alternatively, the WL sidewalls shown in FIG. 6 may be omitted altogether, in favor of larger wings and the bitline sidewalls shown in FIG. 6. Further modifications will occur to those of skill in this art, and all such modifications are deemed to fall within the scope of the present invention. Thus, the present invention is to be limited only by the claims as set forth below.

What is claimed is:

1. A non-volatile memory cell, comprising
   a floating gate having a bottom surface in contact with a tunnel layer formed on a substrate, a top surface, and sidewall surfaces oriented along a bitline direction and along a wordline direction of the memory cell;
   a dielectric layer, the dielectric layer covering at least a portion of the top surface and covering at least a portion of the sidewall surfaces oriented along the bitline and wordline directions;
   a control gate, the control gate overlapping the floating gate over substantially all of its top surface and sidewall surfaces;
   a top layer including a nitride and formed on the control gate, and
   a plurality of sidewall spacers including a nitride and disposed against the top layer and sidewalls of the control gate.

2. The non-volatile memory cell according to claim 1, wherein the dielectric layer includes an ONO layer.

3. The non-volatile memory cell according to claim 1, wherein the dielectric layer forms at least one extension on the substrate in the bitline direction.

4. The non-volatile memory cell according to claim 3, wherein a thickness of the control gate along the wordline direction is about equal to a length of the at least one extension of the dielectric layer on the substrate.

5. The non-volatile memory cell according to claim 1, wherein, the plurality of sidewall spacers are further disposed against the dielectric layer.

6. The non-volatile memory cell according to claim 5, further comprising at least one self-aligned contact, the at least one self-aligned contact being aligned with an edge of the top layer, and having a tapered shape that conforms to a shape of the sidewalls spacers.

7. The non-volatile memory cell according to claim 5, wherein the top layer and the plurality of sidewall spacers layer are made of a material having a lower etch rate than an etch rate of an overlying interlayer dielectric.

8. The non-volatile memory cell according to claim 5, wherein the top layer and the plurality of sidewall spacers comprise silicon include a nitride.

9. A non-volatile memory cell having a high coupling ratio, comprising:
   a floating gate separated from a substrate by a tunnel layer, a width of the tunnel defining a width of an active region of the cell,
   a dielectric layer, the dielectric layer overlapping the floating gate over substantially all surfaces thereof not in contact with the tunnel oxide, the dielectric layer forming wings oriented along a wordline direction, the wings having widths that are less than the width of the active region and less than about 0.2 $\mu$m;
   a control gate overlapping substantially all of the floating gate and having sidewalls oriented along both a wordline direction and a bitline direction of the memory cell.

10. The non-volatile memory cell according to claim 9, wherein a width of the memory cell is about equal to a minimum pitch of a field oxide mask used to define field oxide isolation structures of the memory cell.

11. The non-volatile memory cell according to claim 9, wherein the coupling ratio of the memory cell is about 0.67 for a 0.35 $\mu$m process and a dielectric layer to tunnel layer thickness ratio of about 2.2.

12. The non-volatile memory cell according to claim 9, further comprising:
    sidewall spacers disposed against the sidewalls of the control gate; and
    self-aligned bitline and Vss contacts, the bitline and Vss contacts being self-aligned to the control gate sidewalls and including a tapered end conforming to a shape of the sidewall spacers.

13. The non-volatile memory cell according to claim 12, further comprising heavily doped well regions under the bitline and Vss contacts, lightly doped source and drain regions aligned with the sidewalls of the control gate and at least one implant region aligned with an interior surface of the dielectric layer.

14. A non-volatile memory cell, comprising:
    a substrate,
    a tunnel oxide formed on the substrate;
    a floating gate disposed on the tunnel oxide and having sidewall surfaces along a bitline direction and a wordline direction;
    a dielectric layer formed on the floating gate and along at least one sidewall surface thereof that is oriented along the wordline direction;
    a control gate overlapping the floating gate, the control gate having a non-zero thickness along at least one floating gate sidewall surface oriented in the wordline direction;
    a top layer including a nitride disposed on the control gate, and
    sidewall spacers disposed along outside edges of the control gate, the sidewall spacers including a nitride.

15. The non-volatile memory cell according to claim 14, wherein the dielectric layer and the control gate also extend along the sidewall surfaces of the floating gate oriented along the bitline direction.

16. The non-volatile memory cell according to claim 15, wherein the dielectric layer extends in the bitline direction along the substrate for a distance determined by a thickness of the control gate along the wordline direction.

* * * * *